United States Patent [19]

Trimberger

[11] Patent Number: 5,426,379
[45] Date of Patent: Jun. 20, 1995

[54] FIELD PROGRAMMABLE GATE ARRAY WITH BUILT-IN BITSTREAM DATA EXPANSION

[75] Inventor: Stephen M. Trimberger, San Jose, Calif.

[73] Assignee: Xilinx, Inc., San Jose, Calif.

[21] Appl. No.: 283,122

[22] Filed: Jul. 29, 1994

[51] Int. Cl.⁶ .................. G06F 7/38; H03K 19/173
[52] U.S. Cl. ........................... 326/39; 326/38
[58] Field of Search ............. 326/41, 40, 39, 38; 365/189.08; 377/26, 75, 76

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,855,954 | 8/1989 | Turner et al. | 365/185 |
| 4,940,909 | 7/1990 | Mulder et al. | 307/465 |

OTHER PUBLICATIONS

Xilinx Programmable Gate Array Data Book, 1994, available from Xilinx, Inc., 2100 Logic Dr., San Jose, Calif. 95124.

*Primary Examiner*—Edward P. Westin
*Assistant Examiner*—Stephen Calogero
*Attorney, Agent, or Firm*—Edel M. Young; John S. Ferrell

[57] ABSTRACT

A programmable gate array comprises an array of configurable logic blocks. Each configurable logic block is controlled by one or more rows and columns of memory cells in a memory array. According to the invention, an older bitstream may be used without modification in a newer programmable gate array. A frame register includes a plurality of active memory locations called frame bits which correspond to columns of memory cells within the memory array and at least one spare frame bit which does not correspond to a column of memory cells within the memory array. A similar configuration of row pointer cells comprises a shift register for enabling row by row addressing of the memory array. Spare frame bits and spare pointer cells are selectively either loaded or bypassed by programmable selector circuits, permitting expansion of the memory array in future programmable gate arrays, and thereby allowing additional functionality to be added to later versions of the programmable gate array without requiring designers of gate array applications to modify bitstreams which they previously designed.

25 Claims, 10 Drawing Sheets

FIELD PROGRAMMABLE GATE ARRAY WITH BUILT-IN BITSTREAM DATA EXPANSION

BACKGROUND OF THE INVENTION

1. Field of the Invention

This invention relates to gate arrays, and more particularly to a field programmable gate array that is programmed by loading a bitstream of data.

2. Description of the Background Art

Digital logic can be implemented using several options: discrete logic devices, often called small-scale integrated circuits or SSI, programmable devices such as programmable logic arrays (PLAs) or programmable logic devices (PLDs), masked-programmed gate arrays or cell-based application specific integrated circuits (ASICs), and field programmable gate arrays (FPGAs).

FPGAs are general purpose programmable devices that are customized by the end users. FPGAs are composed of an array of configurable logic blocks that are programmably interconnected. The basic device architecture of an FPGA consists of an array of configurable logic blocks (CLBs) embedded in a configurable interconnect structure and surrounded by configurable I/O blocks (IOBs). An IOB allows signals to be driven off-chip or optionally brought onto the FPGA onto interconnect segments. The IOB can typically perform other functions, such as tri-stating outputs and registering incoming or out-going signals. The configurable interconnect structure allows users to implement multi-level logic designs (multi-level refers to logic in which the output signal of one logic unit provides input to another logic unit and the output of that provides input to another, etc.). An FPGA can support tens of thousands of gates of logic operating at system speeds of tens of megahertz. The FPGA is programmed by loading programming data into the memory cells controlling the configurable logic blocks, I/O blocks, and interconnect structure. Further information about FPGAs appears in "The Programmable Logic Data Book", copyright 1994 by Xilinx, Inc. and available from Xilinx, Inc. at 2100 Logic Drive, San Jose, Calif. 95124, which is incorporated herein by reference.

Each configurable logic block in the FPGA can include configuration memory cells for controlling the function performed by that logic block. These configuration memory cells can implement a lookup table, control multiplexers, and control other logic elements such as XOR gates and AND gates. A lookup table stores a truth table which implements that combinational logic function corresponding to the truth table. Each configurable logic block may also be defined to include an adjacent portion of the interconnect structure. The interconnect structure includes programmable interconnect points which control the connection of wiring segments in the programmable interconnect network of the FPGA. Each programmable interconnect point may be a pass transistor controlled by a configuration memory cell. Wire segments on each side of the pass transistor are either connected or not connected depending on whether the transistor is turned on by the corresponding configuration memory cell. The multiplexer is a special-case one-directional routing structure that is controlled by a configuration memory cell. Although the multiplexer can be any width, controlling multiplexers with many inputs will require additional configuration memory cells. Switches that are built using multiplexers require fewer configuration memory cells than the number of multiplexer inputs.

Configuration is the process of loading a bitstream containing the program data into the configuration memory cells which control the configurable logic blocks and I/O blocks of the FPGA. The bitstream is loaded into the FPGA serially to minimize the number of pins required for configuration and to reduce the complexity of the interface to external memory. The bitstream is broken into packets of data called frames. As each frame is received, it is shifted through a frame register until the frame register is filled. The data in the frame register of the FPGA are then loaded in parallel into one row of configuration memory cells forming the memory array. (The configuration memory cells which control a configurable logic block typically occupy a two dimensional section of the array.) The configuration memory cells make up the lookup tables and control programmable interconnect points, multiplexers, and other programmable elements of a configurable logic block or I/O block. Following the loading of the first frame, subsequent frames of bitstream data are shifted into the FPGA, and another row of configuration memory cells in the array of CLBs is designated to be loaded with a frame of bitstream data.

As an FPGA product line goes through its product life cycle, added features and upgrades of the original product versions are often made. In most cases, the original FPGA version does not anticipate in advance all the features that will be added in the upgrades. The upgraded FPGAs typically expand on the previous FPGA versions by the addition of minor variations. For example, an upgraded FPGA may have user writeable memory where the original version does not, or a later FPGA has carry logic and the original FPGA does not have carry logic. These variations between FPGA versions can require using extra bits in the configuration memory to program the added features. As additional bit locations in the configuration memory cells are required, one practice is to expand the frame register to accommodate the additional bit locations. However, the expanded frame register version of the FPGA is no longer bitstream compatible with the original version. Different sized bitstreams are used to program the original version and the expanded version of the FPGA. Maintaining bitstream compatibility as an FPGA product line goes through its product life cycle is important. It is desirable that a newly upgraded FPGA still be able to accept the previous FPGA bitstream so that a user need not generate a new bitstream in order to use an upgraded FPGA.

Also, it may be advantageous to a producer of FPGAs to stop producing earlier versions of the FPGA product line and just produce the later versions of the FPGA product line. By preserving bitstream compatibility throughout an FPGA product life cycle, later versions of the FPGA product line can be used to replace the earlier versions so that producers of FPGAs can reduce the number of different FPGAs in their inventory and yet customers need not redesign their bitstreams.

In the past, Xilinx, Inc has sold FPGAs which initially were configured by bitstreams having bits which did not get loaded into memory cells in a configuration memory. These unused bits were provided in order to fill out a rectangular array of bits for specified parts of the FPGA, such as a logic block of the FPGA. In these FPGAs, the unused bits were loaded from the bitstream into a frame register but were not loaded into a portion of the memory which configured the FPGA. The software which generated bitstreams for these first FPGAs always selected a default value for the unused bits. When designing second generation FPGAs, Xilinx, Inc. was able to add features while maintaining compatibility with older bitstreams. Since the unused bits in the earlier bitstreams were always given a default value, the new FPGAs were designed to perform identically to the older FPGAs when the unused bits carried their default values. But when the previously unused bits Carried the opposite value, additional features not available in the older FPGAs were implemented. Thus the user could load an older bitstream into a newer FPGA and get the same result obtained in the older FPGA or by generating a new bitstream using the previously unused bits the user could control the new features. In the second generation FPGAs, additional memory cells were provided in the configuration memory and these additional memory cells were then controlled by the previously unused bits. However, in these earlier FPGAs, no planning was done to allow for future expansion of bitstreams so that future FPGAs can be designed which are bitstream compatible with earlier FPGAs but can be programmed to provide additional features.

Therefore, it is desirable to design FPGAs that can incorporate added new features and upgrades while maintaining bitstream compatibility. The improved FPGA should be capable of meeting the expansion requirements as the FPGA product line goes through its product life cycle.

SUMMARY OF THE INVENTION

The present invention applies to a programmable device which includes a configuration memory, a plurality of configurable logic blocks, and a configurable interconnect structure in which the configuration memory controls the configuration of the logic blocks and interconnect structure. Such a device is commonly called an FPGA. According to the invention, a frame register included in the device includes active cells which transfer configuration data to groups of cells in the configuration memory and one or more spare cells which may store configuration data but do not transfer configuration data to any cells in the configuration memory.

The active cells of the frame register are loaded with bitstream data which are written to memory cells in the configurable logic blocks of the memory array. The spare frame register cells receive bitstream data which are not written into the memory array. These spare frame register cells permit expansion of the memory array in future FPGA designs, allowing additional bitstream data to be loaded to cells of the frame register which correspond to spare cells on an earlier FPGA. Whet the future FPGA is built and the additional programming bits are needed to control new features, the no-longer-Spare frame cells are connected to cells in a correspondingly larger memory. The new memory cells control the new features. This way, the new FPGA with the larger memory can be programmed by a bitstream originally generated for an older FPGA, and can also be programmed with a bitstream which takes advantage of the new features.

row and Column Embodiment with Row Pointer

In one embodiment, the memory is arranged in rows and columns. Each active cell in the frame register corresponds to a column in the memory, each spare cell in the frame register corresponds to no part of the memory, and the device further includes a row pointer to select a row into which data from active cells in the frame register can be transferred. Future FPGAs can be designed with the same size frame register and an expanded configuration memory. The expanded memory includes a column of cells corresponding to a cell in the frame register which was spare in the earlier FPGA. As before, the new FPGA can be loaded with either an old bitstream designed for an older FPGA or with a new bitstream taking advantage of new features.

Embodiment with Row Pointer Register Having Spare Cell

In another embodiment, the memory is also arranged in rows and columns and the provision for future expansion is provided in a row pointer register. In this embodiment spare frame cells may or may not be provided. The row pointer register includes a plurality of row pointer cells, some of which are active and therefore point to a corresponding row into which bitstream data are to be loaded and at least one of which is a spare pointer cell which does not point to a corresponding row of the memory. The spare row pointer cell or cells may be interspersed with active row pointer cells or may be positioned at the end of the row pointer register. In one embodiment, dummy data are loaded into the spare pointer cells. In the embodiment having newly added pointer cells at the end of the row pointer register in a newly designed FPGA, no data need be loaded into the memory cells addressed by the newly added pointer cells.

There need be no particular physical relationship between the location of the newly added pointer cells and the rows to which they point. Thus if new features are physically interspersed in a new FPGA through logic blocks and interconnect points which correspond to logic blocks and interconnect points in earlier FPGAs, this can be accomplished by laying out the FPGA to connect the newly added pointer cells to rows of the configuration memory located at physically and logically convenient places.

Embodiment with Memory not in Rows and Columns

In another embodiment, the configuration memory is not arranged in rows and columns but in one or more groups of memory cells. Each group of cells or the entire memory is loaded from the frame register, and again the frame register includes spare cells which hold data not loaded into the configuration memory.

Spare Bit Selector

According to another aspect of the present invention, a programmable selector is coupled to both an active frame cell and to a spare frame cell, and the selector has a control input responsive to a control signal so that the bitstream can be directed around the spare frame cell. Typically, a bitstream includes a preamble which indicates the length of the bitstream and the length of a frame, and may include other data such as the part number into which the data are to be loaded. In one embodiment, the preamble includes one or more selector bits indicating whether certain spare bits are included in the bit stream which follows. A selector controller is coupled to the selector and is responsive to a selector bit stored in a preamble register. When the spare frame bit is not in the bitstream, the selector bit causes the selector not to load bitstream data into a spare frame cell in the frame register. Thus, the bitstream does not have to include spare frame bits.

Row Pointer Register With Spare Cell and Spare Bit Selector

According to another aspect of the present invention, the row pointer register includes at least one spare pointer cell that does not point to a corresponding row of memory cells in the memory array. A pointer selector is coupled to a first pointer cell, a second pointer cell, and the spare pointer cell, and select the first pointer register to point to a first row and the second pointer to point to a second row. The pointer selector enables bypassing of the spare pointer cell. The sparer pointer cell allows adding a row of configuration memory cells in a future FPGA. Additional spare pointer cells can be incorporated to permit additional rows of an expanded memory array to be accessed. A pointer selector is coupled to receive a preamble bit for selecting whether an extra frame of configuration bits will be loaded into a row of the future FPGA.

Row Pointer Controlled by Counter and Decoder

In another embodiment, the memory is arranged in rows and columns and a frame register loads columns of the array. However, no row pointer register is provided. Instead, a row to be loaded with data from the frame register is selected by a counter and a count decoder. In this embodiment, rows are addressed in numerical Order. However, the decoders may be placed such that higher numbered rows are intersperced with lower numbered rows. Rows which control new features may be given the highest numbers and then simply not loaded when an older bitstream not having the new features is used.

Method of Operation

The present invention can also be characterized as a method of designing and operating a programmable gate array comprising the steps of creating a memory array having a plurality of memory cell, providing a frame register having a plurality of memory locations that are greater in number than a corresponding number of columns of memory cells in the memory array, and providing a frame pointer having a plurality of pointer registers which point to corresponding rows of the memory cells in the memory array.

Other aspects and advantages of the present invention can be seen upon review of the Figures, the Detailed Description and the claims which follow.

DESCRIPTION OF THE PREFERRED EMBODIMENT

Figure 1:
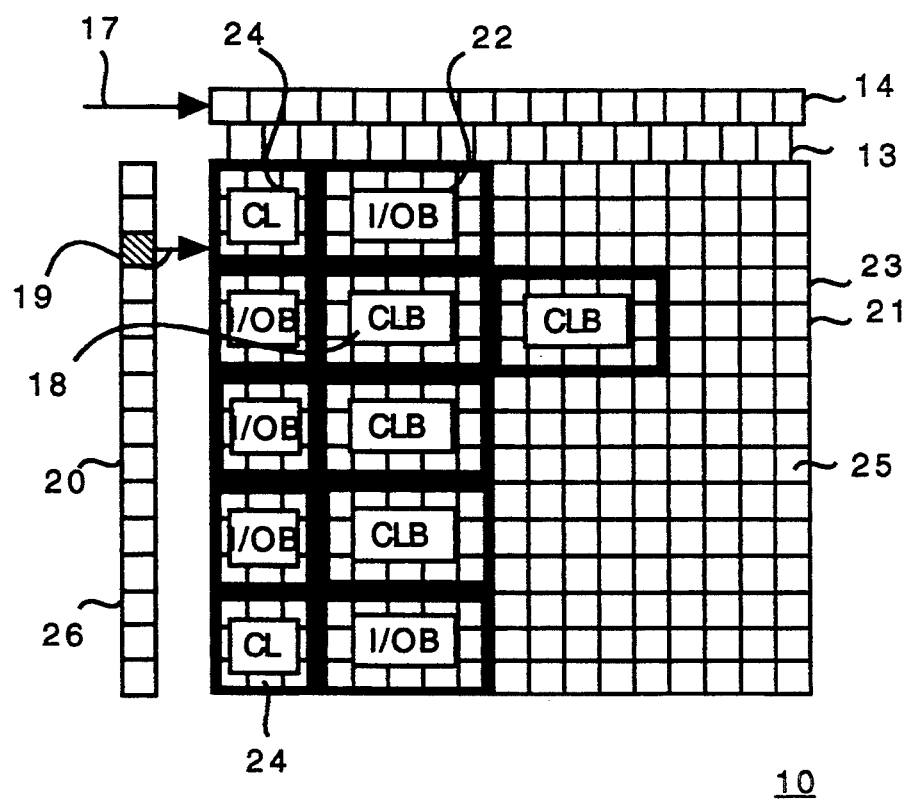
FIG. 1 depicts a simplified section of a field programmable gate array architecture of the prior art, outlining the layout of programming registers that are used for programming the field programmable gate array.

Referring now to FIG. 1, an overview diagram is shown depicting the architecture of a conventional Logic Cell Array (LCA) 10 field programmable gate array (FPGA). Configuration memory array 12 consists of a matrix of memory cells 25 which function, among other things, as look-up table memory and routing selectors in the implementation of FPGA logic. A detailed description of the organization of the configuration memory array 12 can be found in the *Programmable Logic Data Book*, pages 2-105 to 2-132, published by Xilinx, Inc., 1994. The matrix of memory cells 25 is organized in regular discrete arrays to control Configurable Logic Blocks 18 (CLBs). Configuration memory array 12 is shown as 3×5 arrays of memory cells 25. In an actual FPGA the array is much larger than 3×5. The CLBs 18 are bounded on all four sides by input-/output blocks (IOBs) 22. The IOBs communicate data between external pins and the CLBs 18. Corner logic blocks 24 are located in each of the four corners of the configuration memory array 12. The corner logic blocks 24 perform special functions and will be discussed further with reference to FIG. 5 below. Loading of data into configuration memory array 12 is performed from a frame register 14 shown in FIG. 1 above the configuration memory array 12 and connected to the configuration memory array 12 by connect lines 13. Frame register 14 is a conventional serial shift register that receives bitstream 17 which is sequentially clocked into the frame register 14 of FIG. 1 from left to right.

Figure 2:
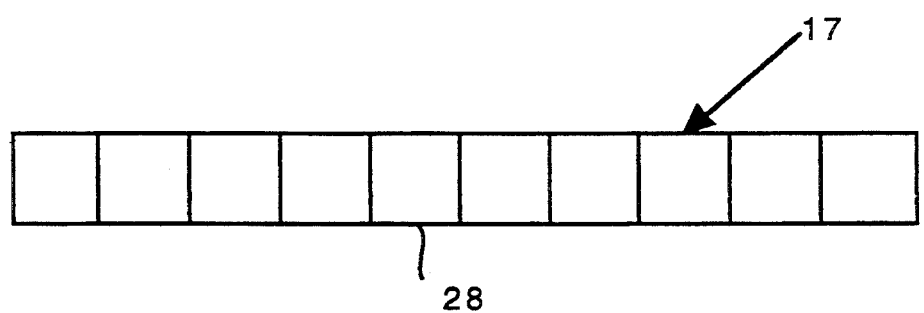
FIG. 2 depicts a block diagram of a section of bitstream.

Referring also now to FIG. 2, an exemplary data structure of bitstream 17 is shown consisting of a sequentially concatenated series of data bits 28. The CLBs 18 and IOBs 22 are configured by shifting bitstream 17 into frame register 14 and then loading the contents of frame register 14 in parallel into rows of the memory array. In order to facilitate the parallel loading of bitstream 17 from frame register 14 into a row of the memory array, a row pointer 19 in shift register 16 points sequentially to each row such as rows 21, 23. Shift register 16 consists of a sequential series of pointer cells 20, each storing a Logic '0', with the exception of one bit storing a Logic '1' which is referred to as the row pointer 19. The row pointer 19 shifts sequentially through the shift register 16 starting from the bottom cell 26 to sequentially load the contents of the configuration memory array 12 on a row-by-row basis. For example, during loading of the configuration memory array 12, row pointer 19 will at some point be addressing row 21. Pointer 19 causes the data in frame register 14 to be loaded into row 21. Following the loading of the contents of frame register 14 into row 21, the row pointer 19 would shift up one pointer cell 20 and point to row 23 of the configuration memory array 12. With row pointer 19 addressing row 23, frame register 14 will sequentially shift in a new frame of bitstream 17, and once the frame register 14 is completely loaded, the contents of frame register 14 will be loaded in parallel to row 23 of the memory array 12. In this manner, each of the rows of configuration memory array 12 is sequentially loaded with a frame of bitstream 17. Alternatively, row pointing can be accomplished using equivalent conventional techniques such as with decoders, demultiplexers, or state machines.

As can be seen from FIG. 1, a significant amount of data are shifted into frame register 14 for storage in a configuration memory array 12 during configuration of the logic cell array 10. An actual bitstream in an FPGA is on the order of 10,000 to 2,00,000 bits long. The compilation of a bitstream 17 represents a significant investment in time and engineering design resources by the designer of an FPGA application. When using prior art FPGAs 10 of FIG. 1, each time configuration memory array 12 changes, as during a product improvement cycle, the designer of the FPGA application must recompile the bitstream.

Figure 3:
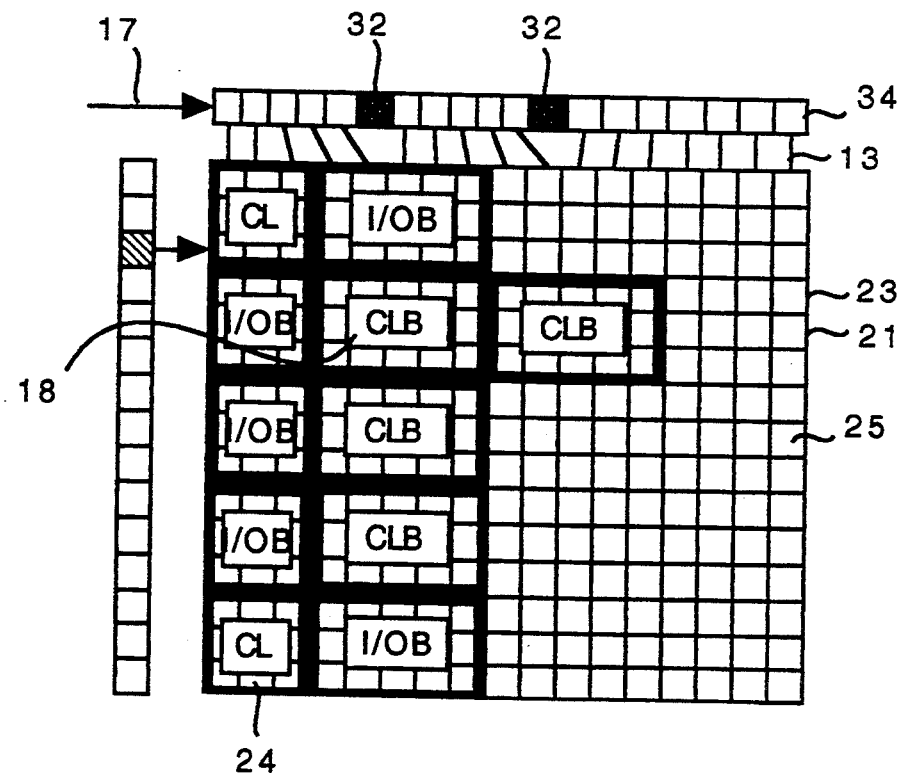
FIG. 3 depicts a simplified field programmable gate array architecture outlining a modified frame register structure for the programming of registers in the present invention.

Referring now to FIG. 3, one embodiment of the present invention is shown in which the identical configuration memory 12 is used as in FIG. 1, but in which the conventional frame register 14 (of FIG. 1) is replaced by a modified register 34 containing one or more spare frame bits 32. These spare frame bits 32 remain unused with configuration memory 12, but provide for bitstream 17 compatibility as the configuration memory 12 is modified and enlarged. These spare frame bits 32 are unutilized when the original bitstream 17 is initially generated, and are originally programmed with Logic '0' data in this preferred embodiment. As the data are loaded from the frame register 34 into the memory array 12 during FPGA configuration, the contents of spare frame bits 32 are not loaded into the configuration memory array 12. When an upgraded FPGA is developed, it may include an enlarged memory array which makes use of the spare frame bits 32 and yet a bitstream developed for an earlier FPGA may be used in the new FPGA with no modification. The new features in the new FPGA are not activated by the earlier bitstream but they are available for use by designers who generate new bitstreams.

Figure 4:
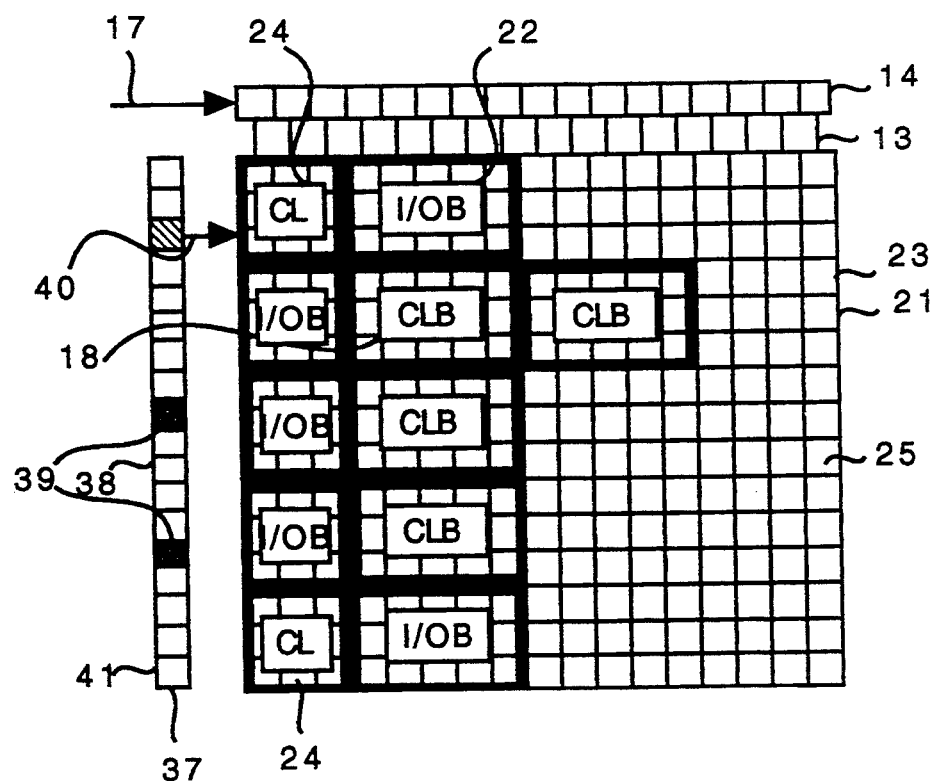
FIG. 4 depicts an embodiment of the present invention utilizing a modified shift register structure for locating the frame pointer.

Referring now to FIG. 4, an alternative embodiment is shown in which an FPGA 35 contains the same configuration memory array 12 as in FIG. 1, and the same frame register 14 as in FIG. 1. However, a modified row pointer 37 includes one or more spare pointer cells 39. A spare pointer cell 39 is utilized in a manner very similar to the spare frame bits 32 of FIG. 3. Row pointer 37 contains many Logic '0' bits within pointer cells 38. A frame pointer 40 containing a Logic '1' shifts from pointer cell to pointer cell starting with the bottom cell 41. The frame pointer 40 continues shifting upward through the cells as each frame of bitstream 17 is loaded from frame register 14 into the rows (21, 23) of cell memory array 12. When pointer bit 40 occupies a spare pointer cell 39, no row of configuration memory array 12 is loaded. Effectively then, the frame of bitstream data associated with spare pointer cell 39 is unused in the logic cell array 35. The extra frame in the bitstream 17 remains available for upgrades to FPGA 35 which contain additional bits in configuration memory array 12. In one embodiment, the unused bits must be set to Logic '0' for compatibility with a later part which offers features which use this frame of bits.

Although FIG. 3 shows the incorporation of spare frame bits 32 and FIG. 4 separately shows the inclusion of the spare pointer cells 39 as individual embodiments, it would be obvious to one of ordinary skill in the art that these two improvements can be combined into a programmable gate array having both spare frame bits 32 as well as spare pointer cells 39.

The addition of spare frame bits 32 in FIG. 3 and spare pointer cells 39 in FIG. 4 provides upward compatibility of the bitstream 17. However, the additional bit spaces (32, 39) tend to add excess overhead to the system incorporating the FPGA, especially when entire frames of unused bits must be provided. Even though the extra bits used to fill bit spaces (32, 39) are not Used they must be included in the bitstream data 17 and loaded into the frame register and discarded. The added memory and time to store and load the FPGA can be significant in a large FPGA. Additional circuitry designed to alleviate the need to generate, store, and load unused data into bitstream 17 is discussed in the figures below.

Figure 5:
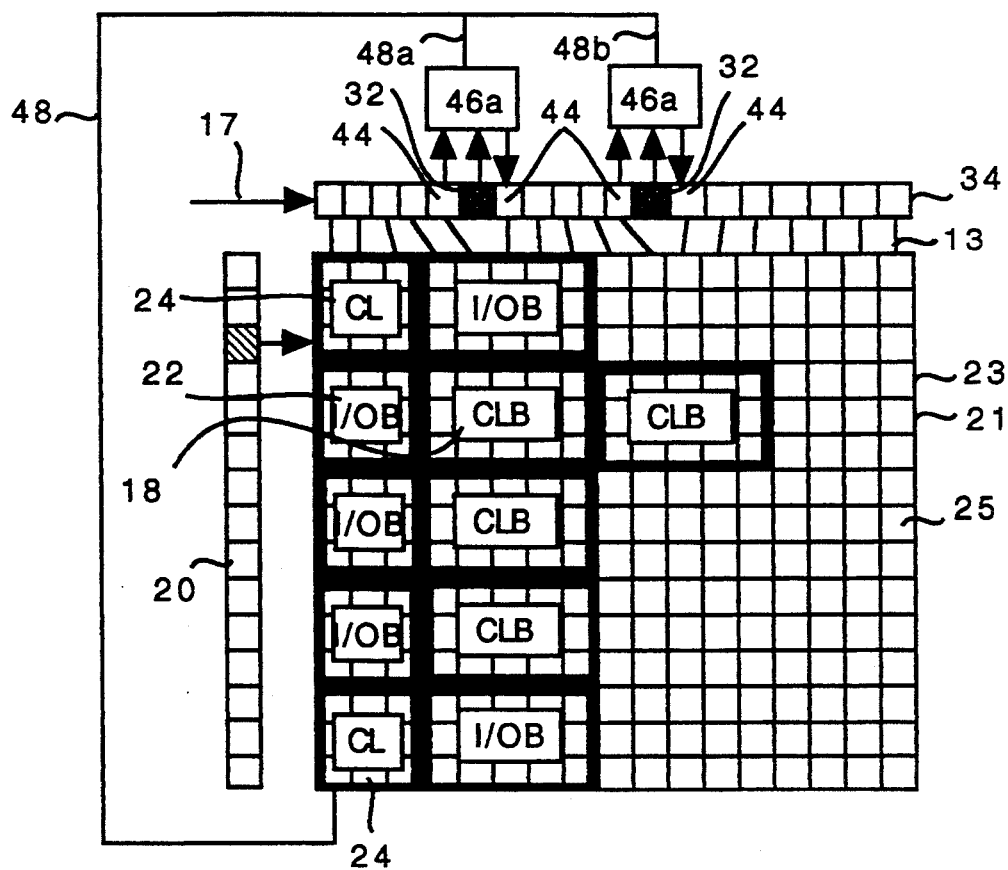
FIG. 5 depicts the field programmable gate array architecture of FIG. 3 containing additional circuitry for bypassing spare frame registers.

Referring now to FIG. 5, an embodiment of the present invention is shown that incorporates additional circuitry to bypass providing and loading of the spare frame bits 32 when the spare frame bits are unconnected to the configuration memory array 12. As before, input/output blocks (IOBs) 22 and corner logic 24 are located about the perimeter of configuration memory array 12. As before, bitstream 17 provides programming data to the IOBs 22 and the corner logic 24 just as according to FIG. 1.

Selectors 46a of FIG. 5 are coupled to corner logic 24 via control lines 48 (48a and 48b) and are programmed from preamble data loaded into corner logic 24 before configuration memory array 12 configuration. Each selector 46a is coupled to a spare frame bit 32 as well as to a pair of adjacent frame bits 44a and 44b, each of which is adjacent to the spare frame bit 32. Selector 46a provides a bypass path for the bitstream data as it is shifted into frame register 34. Each selector 46a has a select input to control the selector 46a functionality. In a first configuration, selector 46a bypasses the spare frame bit 32 and enables the bitstream 17 to load into the frame register 34 moving directly from bit 44a to bit 44b without occupying the spare frame bit 32. It should be noted that a single selector 46a can equivalently bypass more than a single spare frame bit 32 and that several selectors 46a can be separately controlled by independent data bits in the preamble. In a second configuration, the selector 46a enables the bitstream data 17 to be shifted from bit 44a into the spare frame bit 32 and sequentially into the net adjacent frame bit 44b.

Figure 6:
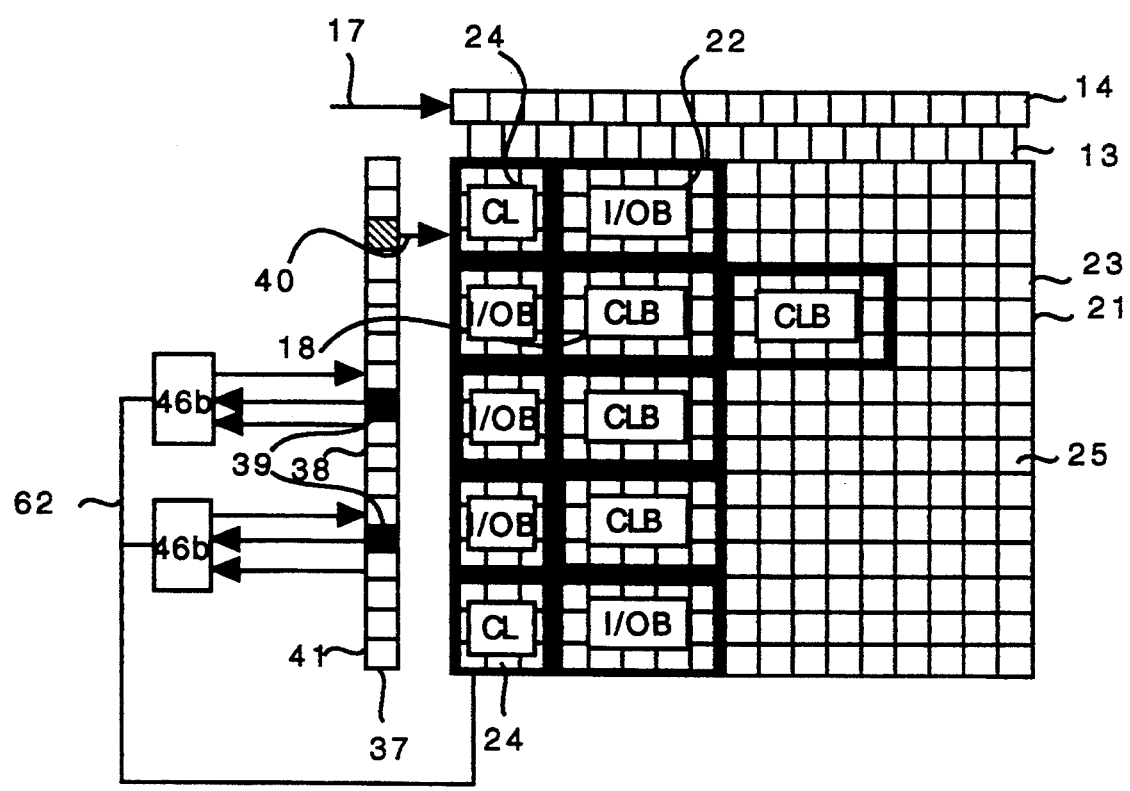
FIG. 6 depicts the field programmable gate array architecture of FIG. 4 containing additional circuitry for bypassing spare pointer cells.

Referring now to FIG. 6, an embodiment of the present invention is shown that incorporates circuitry for selectively bypassing spare pointer cells 39 during the configuration of configuration memory array 12. Corner logic 24 generates a control signal 62 for programming the functionality of a selector 46b. Just as in the operation of the frame register 34 of FIG. 5, spare pointer cells 39 are bypassed by selector 46b when not in use. In a first programmed configuration, selector 46b bypasses the spare pointer cells 39 and enables the frame pointer 40 to shift sequentially along pointer cells 38 in the shift register 37, without occupying the spare pointer cells 39. In a second programmed configuration, as controlled by the control signal 62 from the corner logic 24, the selector 46b enables the frame pointer 40 to be shifted into the spare pointer cells 39. It should be noted that a single selector 46b can equivalently bypass more than a single spare pointer cell 39. Also, several selectors 46b can be separately controlled by independent data bits in the preamble. By utilizing the bypass mechanism of selectors 46b, the benefits of having spare pointer cells 39 is realized without having the previously discussed overhead costs of unused data being contained in the bitstream 17. The techniques described in FIG. 5 and FIG. 6 can be used independently or in combination to achieve efficiency of bitstream 17.

Figure 7:
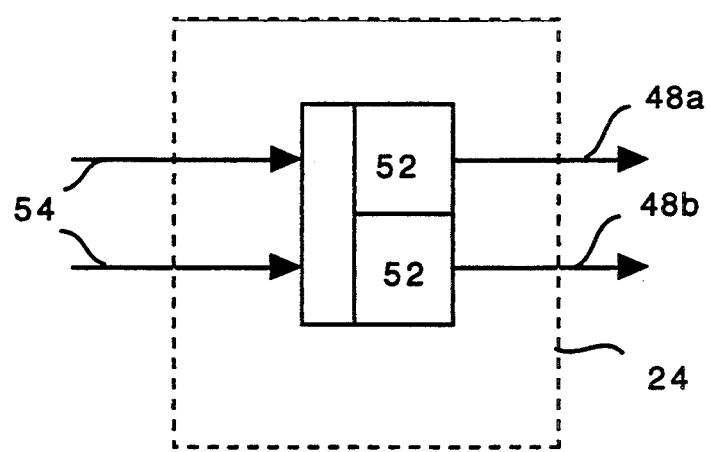
FIG. 7 illustrates detail of the corner logic of an FPGA having the features of FIGS. 5 and 6.

Referring now to FIG. 7, a block diagram showing a section of corner logic 24 is illustrated. Corner logic 24 contains one or more preamble bits 52 which are loaded from the frame register 14 or directly from bitstream 17 before frame register 14 begins to be loaded. Each preamble bit 52 drives a selector line 4B (48a, 48b), to either a high or low state according to the value of the preamble bit. In the example of FIG. 5 where two selectors 46a are used to bypass spare frame bits 32, two selector lines 48a and 48b are used for the purpose of selector 46a control. In this example, control line 48a is used to program a first selector 46a, and selector line 48b is used to program a second selector 46b. Lines used to load selector data 54 are preferably connected to corresponding frame bits in the frame register 14, and are used to directly load bitstream 17 during configuration of the configuration memory array 12. Alternatively, selector data 54 are encoded or multiplexed such that either fewer or more data lines than data bits are required to load preamble bits 52 with selector data 54. The corner logic 24 used to drive selectors 46a in the frame register 34 may be identical to the corner logic used to drive selectors 46b in the shift register 37.

Figure 8A:
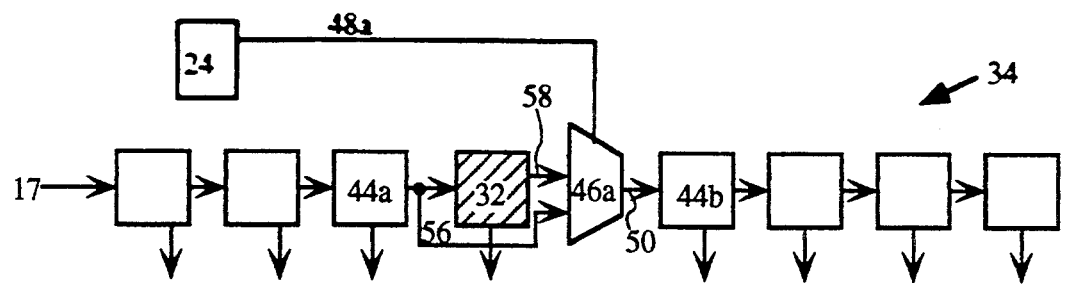
FIG. 8A illustrates additional detail of the selector circuitry of FIG. 5.

Referring now to FIG. 8A, a more detailed diagram is shown of the implementation of selector 46a in conjunction with frame register 34. Selector 46a has two data inputs: a bypass input 56, and an expanded data input 58. The bypass input 56 is connected to frame bit 44a and expanded data input 58 is connected to spare frame bit 32 of frame register 34. The term "spare" refers to a bit which need not be loaded when a newly developed feature is not being used but which may be loaded when a bitstream is provided which uses the new feature. The output of selector 46a connects to frame bit 44b. Corner logic 24 controls selector 46a via control line 48a as discussed above. In a first logic state, the bypass input 56 of selector 46a delivers the logic value of bit 44a to bit 44b as a selector output. When corner logic 24 is configured to a second logic state by a preamble bit 52, selector 46a delivers the contents of spare frame bit 32 to bit 44b through selector output 50. In this way, corner logic 24 identifies when a longer bitstream is present and the spare frame bit 32 is to be used to store the additional (expanded) data in bitstream 17. In this configuration, selector 46a transmits the expanded data to expanded data input 58 of selector 46a and onto selector output 50. The advantage of this circuitry as discussed above with reference to FIG. 2, is that data needs to be stored in the bitstream 17 only if expanded data input 58 is to be utilized. Similarly, an identical configuration may also be used with respect to shift register 37 as described and shown in FIG. 6.

Although FIG. 8A shows only a single spare bit 32, spare bit 32 can be replaced by any number of adjacent spare bits, the rightmost spare bit being followed by multiplexer 46a which receives one input from the rightmost spare bit and the other input from the last active bit 44a to the left of the adjacent spare bits. And, of course, frame register 34 need not be limited to a single spare bit or group of spare bits but may have additional spare bits positioned throughout, each bit or group of bits having its own selector. Each selector multiplexer may be separately controlled or all selector multiplexers may be commonly controlled from a single preamble bit 24.

Figure 8B:
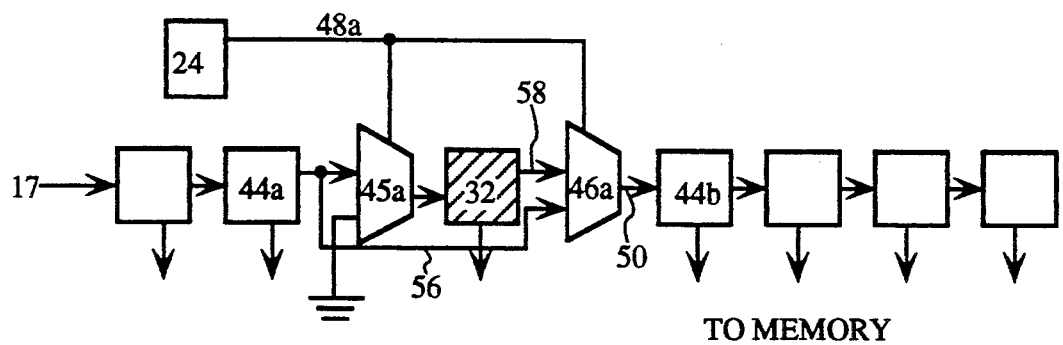
FIG. 8B illustrates another embodiment of the selector circuitry which sets bits in the spare frame registers to logic 0 when no data are provided in the bitstream.

FIG. 8B illustrates another embodiment of the selector circuitry which sets bits in the spare frame registers to logic 0 when no data for spare frame bit 32 are provided in the bitstream. Multiplexer 45a includes an input lead connected to ground and thus provides a logic 0 output signal when control line 48a carries a logic 0. This assures that configuration memory cells loaded by spare frame bit 32 will carry logic 0 when spare frame bit 32 is being bypassed.

Figure 8C:
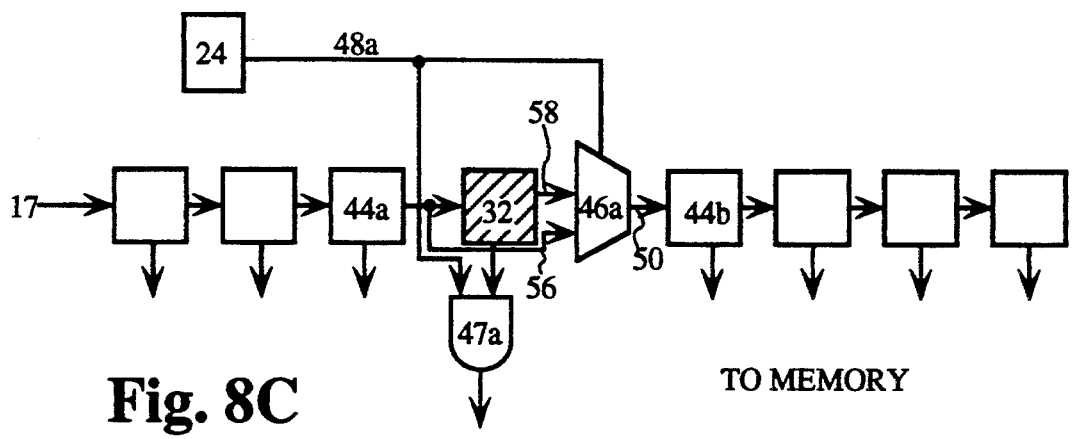
FIG. 8C illustrates a further embodiment which loads logic 0 into the spare column of memory when no data are provided in the bitstream for a spare bit.

FIG. 8C illustrates a further embodiment which loads logic 0 into the spare column of memory when no data are provided in the bitstream for a spare bit. In this embodiment, AND gate 47a provides logic 0 output whenever corner logic 24 provides a logic 0 on control line 48a. This embodiment provides the same advantages as the embodiment of FIG. 8B, whereby configuration memory bits loaded by frame bit 32 will always hold logic 0 when a bitstream not having bits to be loaded by frame bit 32 is used.

Figure 9:
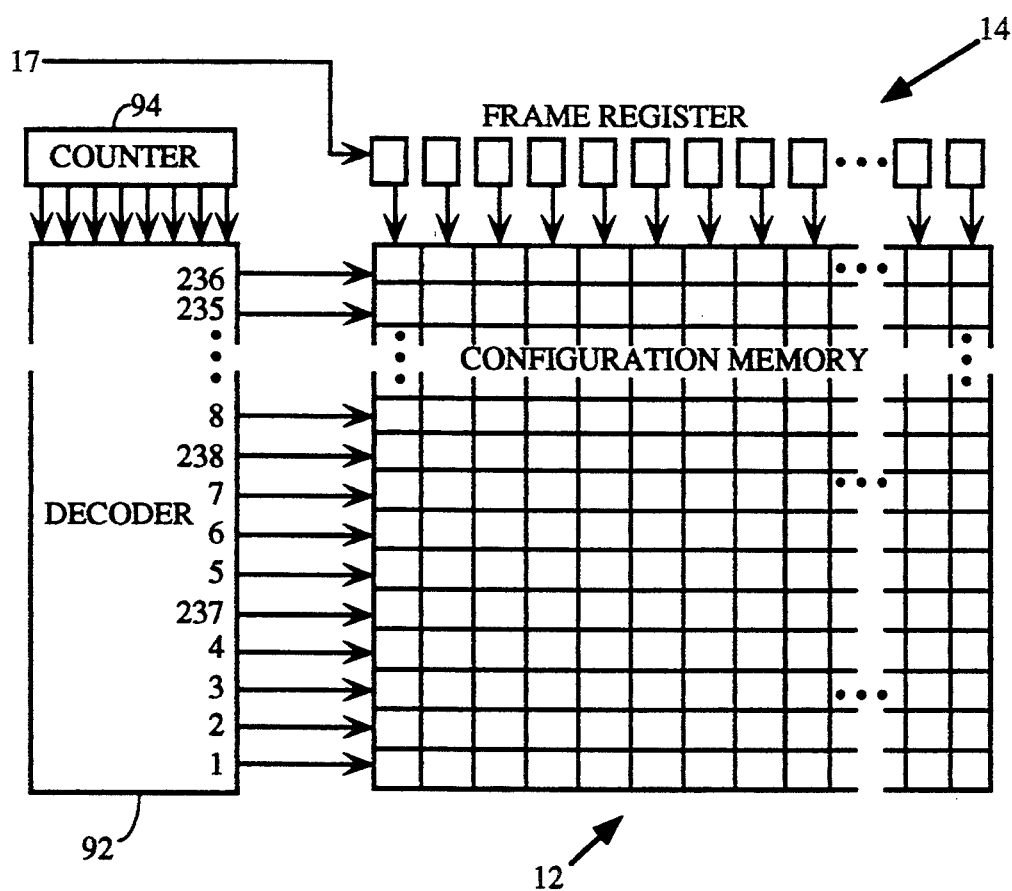
FIG. 9 illustrates an embodiment in which a decoder controlled by a counter addresses rows to be loaded from the frame register.

FIG. 9 shows another embodiment in which the row pointer register of FIG. 4 is replaced by a counter and decoder combination. Decoder 92 includes a plurality of row address decoders, each of which decodes a different address. New features not present in an earlier FPGA are controlled by memory in rows with higher row numbers than the number of rows in the earlier FPGA. Rows of configuration memory which control the new features are conveniently positioned to control the new features. Decoder 92 then includes corresponding row address decoders to access the new memory. These row address decoders are also conveniently positioned in decoder 92. For example, in the embodiment of FIG. 9, the earlier FPGA included only 236 rows, and thus 236 of the rows of memory in configuration memory 12 are addressed by decoders with row addresses from 1 to 236. New features are controlled by rows with numbers starting at 237. If a bitstream having only 236 rows of frames is loaded into the FPGA of FIG. 9, the higher numbered rows will carry all logic 0 values and the FPGA will behave like the earlier FPGA without the new features. If a bitstream having additional rows of frames to control the new features is loaded, the rows at the end of the bitstream will be loaded into the higher numbered rows and the FPGA of FIG. 9 will implement the new features. Thus the FPGA of FIG. 9 is compatible with earlier bitstreams, does not require preamble information to indicate whether an old or new bitstream is being supplied, and does not require that additional bitstream data be supplied when it is not to be used. The bitstream does of course need preamble information such as typically supplied in conventional bitstreams for Xilinx FPGAs to indicate the total length of the bitstream so that the FPGA can be activated when configuration is done. Counter 94 is a well known up-counter and counts sequentially up at each clock cycle until configuration is complete, as indicated by a "done" signal, not shown here but known from earlier Xilinx devices described in the Xilinx Programmable Logic Data Book discussed above.

In another embodiment, counter 94 is replaced by a plurality of pins for controlling decoder 92. In this embodiment, it is possible to use a bitstream which configures only part of the FPGA, addressing only the rows in which bits are to be changed.

Figure 10:
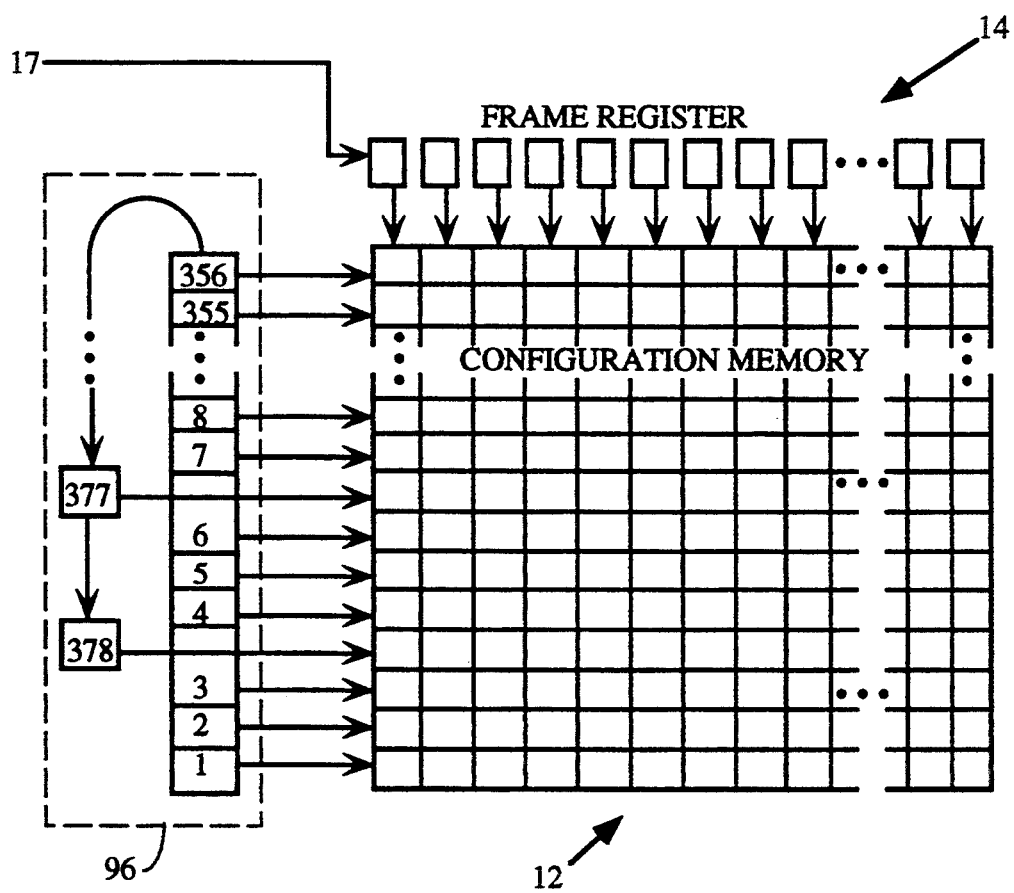
FIG. 10 illustrates an embodiment in which a shift register addresses rows to be loaded and in which additional bits for controlling enhanced FPGA are added at the end of the bitstream.

FIG. 10 shows another embodiment which uses a shift register to select the row to be loaded and shifts a token logic 1 through the shift register to select the row. Shift register 96 shifts a token from cell 1 in sequential order until the bitstream is loaded. An old bitstream may be loaded by the time 356 rows have been loaded, and the shifting may cease at this point and configuration be complete. In this case additional rows of bits selected by cells 357 to 378 will all hold logic 0 and will not implement the features controlled by these rows of memory cells. A newer bitstream which uses all features may include 378 rows of frames and will include preamble information to indicate this size, and when loaded the FPGA will implement all features.

In the embodiments of FIGS. 9 and 10, in order for the FPGA to operate as a previous FPGA when a short bitstream is loaded, any memory cells which will not be loaded must be designed to adopt a logic 0 state upon power up. A memory cell which does so is described by Hsieh in U.S. Pat. No. 4,821,233.

The invention reaches its greatest power for future expansion when the corner logic of an FPGA includes undesignated preamble bits for use in future memory arrays in ways not recognized when the FPGA is designed. For an existing FPGA designed according to the methods of the present invention, the undesignated preamble bits are loaded (preferably) with logical 0 bits. Then when future FPGAs are designed and new features added, both the size and the function of the new bitstream data corresponding to the new features may also be designed. The corner logic of the future FPGAs can include designated logic controlled by these previously undesignated preamble bits. A logical 1 in the bit positions of the previously undesignated preamble bits indicates that additional bitstream data are provided. The future FPGA then loads the additional bitstream data appropriately. The future enhanced FPGA must be constructed so that when the added bits are all logic 0 (in one preferred embodiment), the enhanced FPGA performs the function of the original FPGA. Yet when an earlier bitstream is used with the future FPGA, the future FPGA functions correctly and no change need be made in the earlier bitstream. This aspect of the invention allows for future unplanned expansion with the addition of only a few bits to an existing bitstream, and allows for future expansion without any current knowledge of what features will be present in future FPGAs or how many bits will be required to control the features.

Other embodiments of the invention will become obvious to those skilled in the art in light of the above description. For example, a few preamble bits can allow for unlimited future expansion, because additional expansion bits can be placed not in the preamble but directly into the bitstream of a future FPGA in order to allow for even lengthier future bitstreams when downward compatibility is desired.

I claim:

1. A programmable gate array comprising:
    a memory array having a plurality of memory cells arranged as a number of columns and rows;
    means for controlling the programmable gate array based on values in the memory array;
    a frame register having a plurality of memory locations that are greater in number than the corresponding number of columns in the memory array;
    means for loading frames of a bitstream into the frame register; and
    means for loading data from some but not all of the memory locations into the rows of the memory array.

2. The programmable gate array of claim 1 further comprising:
    a row pointer which points to corresponding rows of the memory array and causes data in the frame register to be loaded into a row of the memory array pointed to by the row pointer.

3. The programmable gate array of claim 1, wherein the frame register comprises:
    a plurality of active memory locations which correspond to the columns of the memory array; and
    at least one spare memory location which does not correspond to a column of the memory array.

4. The programmable gate array of claim 3, wherein the active memory locations of the frame register are loaded with bitstream data and subsequently transferred to the memory array.

5. The programmable gate array of claim 4, wherein the spare memory locations of the frame register do not receive bitstream data.

6. The programmable gate array of claim 4, wherein the active memory locations and the spare memory locations are serially coupled so that the bitstream data are shifted serially into the active memory locations and the spare memory locations of the frame register.

7. The programmable gate array of claim 6 further comprising a selector coupled to at least one of the active memory locations and a spare memory location, the selector having a control input responsive to a control signal so that the bitstream data can be selectively directed to bypass the spare memory locations 8. The programmable gate array of claim 7 further comprising a selector controller coupled to the selector, the selector controller having a preamble register for storing preamble data used by the selector controller in generating the control signal.

9. A programmable gate array comprising:
    a memory array having a plurality of memory cells arranged in columns and rows; and
    a frame register having a plurality of memory locations; and
    a row pointer which points to corresponding rows of the memory array and causes data in the frame register to be loaded into a row pointed to by a cell in the row pointer, wherein the row pointer further comprises at least one spare pointer cell that does not point to a corresponding row of the memory array.

10. A programmable gate array as in claim 9 in which the row pointer comprises a plurality of row pointer cells connected to form a shift registers, the spare pointer cell being part of the shift register.

11. The programmable gate array of claim 10, wherein the row pointer shift register further comprises
    means for shifting data into and out of the spare pointer cell; and
    means for shifting data around the spare pointer cell;
    a pointer selector which selects between the means for shifting data into and out of the spare pointer cell and the means for shifting data around the spare pointer cell.

12. The programmable gate array of claim 11, wherein the spare pointer cell comprises a plurality of adjacent spare pointer cells.

13. A programmable gate array as in claim 9 in which the row pointer comprises a decoder.

14. A programmable gate array as in claim 13 in which the decoder is controlled by off-chip signals.

15. A programmable gate array as in claim 13 in which the decoder is controlled by a counter.

16. The programmable gate array of claim 11, wherein the spare pointer register is selectively bypassed by the pointer selector.

17. A programmable gate array comprising:
means for loading data from a bit stream into an active memory location of a frame shift register;
means for selectively engaging a bypass path around a spare memory location of the frame shift register disposed adjacent to the active memory location;
means for serially shifting the bit stream data along the bypass path and around the spare memory location to a second memory location if the bypass path is engaged; and
means for loading data from the frame shift register to a configuration memory array within the programmable gate array.

18. The programmable gate array of claim 17, wherein the bypass path comprises a selector circuit having a first input connected to the active memory location and a second input connected to the spare memory location.

19. A programmable gate array comprising:
a configuration memory array having memory cells arranged in rows and columns;
means for shifting a frame pointer through a first pointer cell to point to a row in the configuration memory array;
means for selectively engaging a bypass path around a spare pointer cell disposed adjacent to the first pointer cell;
means for serially shifting the frame pointer along the bypass path around the spare pointer cell to a second pointer cell if the bypass path is engaged; and
means for loading data to the row of memory cells in the configuration memory array that is designated by the frame pointer.

20. A method for configuring the configuration memory of a field programmable gate array (FPGA), the method comprising the steps of:
loading data from a bit stream into an active memory location of a frame shift register;
selectively engaging a bypass path around a spare memory location of the frame shift register disposed adjacent to the active memory location;
serially shifting the bit stream data along the bypass path and around the spare memory location to a second memory location if the bypass path is engaged; and
loading data from the frame shift register to the configuration memory array.

21. The method of claim 20, wherein the bypass path comprises a selector circuit having a first input connected to the active memory location and a second input connected to the spare memory location.

22. The method of claim 21 wherein the step of selectively engaging the bypass path further comprises the step of switching a control input on the selector circuit.

23. A method for configuring the configuration memory of a field programmable gate array (FPGA), the method comprising the steps of:
shifting a frame pointer through a first pointer cell to point to a row in the configuration memory array;
selectively engaging a bypass path around a spare pointer cell disposed adjacent to the first pointer cell;
serially shifting the frame pointer along the bypass path around the spare pointer cell to a second pointer cell if the bypass path is engaged; and
loading data to the row of memory cells in the configuration memory array that is designated by the frame pointer.

24. The method of claim 23 wherein the bypass path comprises a selector circuit having a first input connected to the first pointer cell and a second input connected to the spare pointer cell.

25. The method of claim 24 wherein the step of selectively engaging the bypass path further comprises the step of switching a control input on the selector circuit.

* * * * *

UNITED STATES PATENT AND TRADEMARK OFFICE
CERTIFICATE OF CORRECTION

PATENT NO. : 5,426,379

DATED : June 20, 1995

INVENTOR(S) : Stephen M. Trimberger

It is certified that error appears in the above-identified patent and that said Letters Patent is hereby corrected as shown below:

```
Col. 3, line 12, "Carried" should read --carried--.
Col. 3, line 15, "result obtained" should read --result as was
    obtained--.
Col. 3, line 15, "FPGA or" should read --FPGA, or--.
Col. 3, line 57, "Whet" should read --When--.
Col. 3, line 59, "no-longer-Spare" should read
    --no-longer-spare--,
Col. 3, line 66, "row" should read --Row--.
Col. 5, line 8, "select" should read --selects--.
Col. 7, line 18, "2,00,000 bits" should read --200,000 bits--.
Col. 8, line 17, "Used" should read --used--.
Col. 9, line 19, "4B" should read --48--.
```

Signed and Sealed this

Nineteenth Day of December, 1995

*Attest:*

BRUCE LEHMAN

*Attesting Officer*  *Commissioner of Patents and Trademarks*